United States Patent [19]

Jewett

[11] 4,123,989

[45] Nov. 7, 1978

[54] MANUFACTURE OF SILICON ON THE INSIDE OF A TUBE

[75] Inventor: David N. Jewett, Harvard, Mass.

[73] Assignee: Mobil Tyco Solar Energy Corp., Waltham, Mass.

[21] Appl. No.: 832,728

[22] Filed: Sep. 12, 1977

[51] Int. Cl.² .............................................. C23C 13/08
[52] U.S. Cl. .................................... 118/49.5; 427/51; 427/86; 427/248 A; 427/237
[58] Field of Search .................. 118/48, 49.5, 49, 49.1; 427/51, 86, 248 A, 230, 237; 264/81

[56] References Cited

U.S. PATENT DOCUMENTS

| | | | |
|---|---|---|---|
| 3,178,308 | 4/1965 | Oxley | 427/237 V |
| 3,748,169 | 7/1973 | Keller | 118/48 X |
| 3,783,009 | 1/1974 | Tramposch | 427/255 |
| 3,862,020 | 1/1975 | Woerner | 264/81 |
| 3,865,647 | 2/1975 | Reuschel | 427/51 |
| 4,007,074 | 2/1977 | Ogirima | 148/75 |

*Primary Examiner*—Sam Silverberg
*Attorney, Agent, or Firm*—Schiller & Pandiscio

[57] ABSTRACT

A new method and apparatus for producing silicon are disclosed which are characterized by using a silicon tube as the reaction chamber and disproportionating a gaseous silicon compound so as to produce silicon and deposit the same on the inner surface of the reaction chamber.

5 Claims, 3 Drawing Figures

MANUFACTURE OF SILICON ON THE INSIDE OF A TUBE

This invention relates to manufacture of polycrystalline silicon from a gaseous silicon compound and more particularly to manufacture of high purity silicon by a novel method of conducting a vapor deposition reaction involving deposition of silicon on a silicon substrate.

It is well known that silicon may be produced by thermal decomposition or hydrogen reduction of a silicon halide or a silane. It also is well known that elemental silicon may be deposited directly from the gas phase on a solid or partially molten silicon carrier in such a manner as to form a relatively high purity silicon rod. Additionally it is known that silicon-hydrogen-chlorine equilibria are very complex. The foregoing well established knowledge is exemplified by the following publications: U.S. Pat. Nos. 2,993,762, 3,004,835, 3,006,734, 3,140,922, 3,297,501, 3,438,810, 3,748,169 and 3,899,557; and L. P. Hunt et al., A Thorough Thermodynamic Evaluation of the Silicon-Hydrogen-Chlorine System, J. Electrochem. Soc., (Solid-State Science & Technology), pp. 1741–1745, Dec. 1972; T. O. Sedgwick, Analysis of the Hydrogen Reduction of Silicon Tetrachloride Process on the Basis of a Quasi-Equilibrium Model, J. Electrochem. Soc., pp. 1381–1383, Dec., 1964; E. Sirtl et al., High Temperature Reactions in the Silicon-Hydrogen-Chlorine System, J. Electrochem. Soc. (Solid-State Science & Technology), pp. 919–925, July, 1974; and the references cited in the foregoing publications.

Presently it appears that the predominant method of manufacturing high purity polycrystalline silicon for the semiconductor industry is what is sometimes termed the "Siemens process," in which silicon is produced by hydrogen reduction of trichlorosilane silane ($SiHCl_3$) on a heated silicon rod. Since silicon is capable of conducting an electrical current, the silicon rod is heated by passing an electrical current through it. The rod and feed gas are enclosed in a glass or quartz water-cooled chamber and decomposition and deposition are carried out at about 1000° C. The process has the advantages of a relatively readily purifiable feedstock (namely, trichlorosilane), direct deposition onto silicon to form a homogeneous product, a high state of commercial development, and a product of high quality. However, it suffers from several disadvantages as follows: (1) since the rate of deposition is proportional to surface area, the deposition rate on the relatively slim rod (typically about 10 mm. or less) is normally slow (in the order of about 2 microns/minute) and at least about 2–3 days is normally required to achieve a deposition of suitable depth (typically about 40–80 mm); (2) it is energy intensive and electrical power consumption of 400 kwh/kg is common; (3) because of the method of heating, large diameter silicon deposition (with correspondingly larger deposition rates) does not improve the deposition rate/power consumption ratio; (4) efficient utilization of feed gas is difficult to achieve due to a relatively large ratio of chamber volume to silicon surface area; (5) it is inefficient with respect to the proportion of trichlorosilane that is converted to silicon as compared to the proportion that is converted into silicon tetrachloride or other species; and (6) in view of its high state of development, it is difficult to perceive how it can be modified to achieve any major cost reductions.

Furthermore, while the above described "Siemens process" is acceptable for making silicon for end uses such as miniature integrated computer and memory circuits and selected discrete components such as transistors, presently it is not satisfactory as a source of silicon for solar cells intended to serve as electric power generators for homes and other buildings, since (a) solar cells require a lot of silicon, (b) silicon is expensive, and (c) the conversion efficiency of typical silicon solar cells is only about 10–12% at best. Hence it is desirable for large scale solar cell arrays to provide a less expensive method of making highly pure polycrystalline silicon.

Accordingly the primary object is to provide a new method and apparatus for manufacturing relatively high purity silicon which substantially avoids many of the disadvantages and limitations of the "Siemens process" while offering the same or new advantages.

A more particular object is to provide a method of making high purity polycrystalline silicon which is less energy intensive than the "Siemens process" and also provides the benefits of more efficient contact between the silicon-rich reactive species and the substrate on which silicon deposition occurs.

Still other objects are to provide an improved method and apparatus for the purpose described which facilitates control of reaction conditions and deposition rate, assures a high probability of having the reactions go to a higher degree of completion (thereby reducing the need to recycle unreacted silicon-rich feed material) and is adapted to produce silicon by various reaction modes, e.g. pyrolysis of $SiH_4$ (known both as silane or monosilane) or hydrogen reduction of a silicon halide such as $SiHCl_3$ (known both as trichlorosilane or silicochloroform), $SiCL_4$ (silicon tetrachloride), $SiBR_4$ and $SiI_4$.

Another more specific object is to provide a method and apparatus for producing silicon which allows variations in the furnace means employed to contain and heat the substrate, with a consequent savings in equipment and operating costs and the ability to scale up the substrate size and the amount of silicon produced in a given run.

These and other objects are obtained by providing a relatively large silicon tube or an approximation thereof, placing the tube in a furnace so that it can be heated and also insulated to minimize energy input, then passing a feed gas comprising a silicon-rich reactive species through the heated tube so that the gas can contact the inner surface of the tube, and converting the reactive species, e.g., by pyrolysis or reduction, so as to cause elemental silicon to be formed and deposited on the inner surface of the tube. Other features and many of the attendant advantages of this invention are disclosed or rendered obvious by the following detailed description and the accompanying drawings wherein:

In the several figures identical parts are identified by identical numerals.

The illustrated apparatus is designed to produce silicon by hydrogen reduction of trichlorosilane but it also may be used for production of silicon by other methods, e.g., by pyrolysis of silane.

Figure 1:
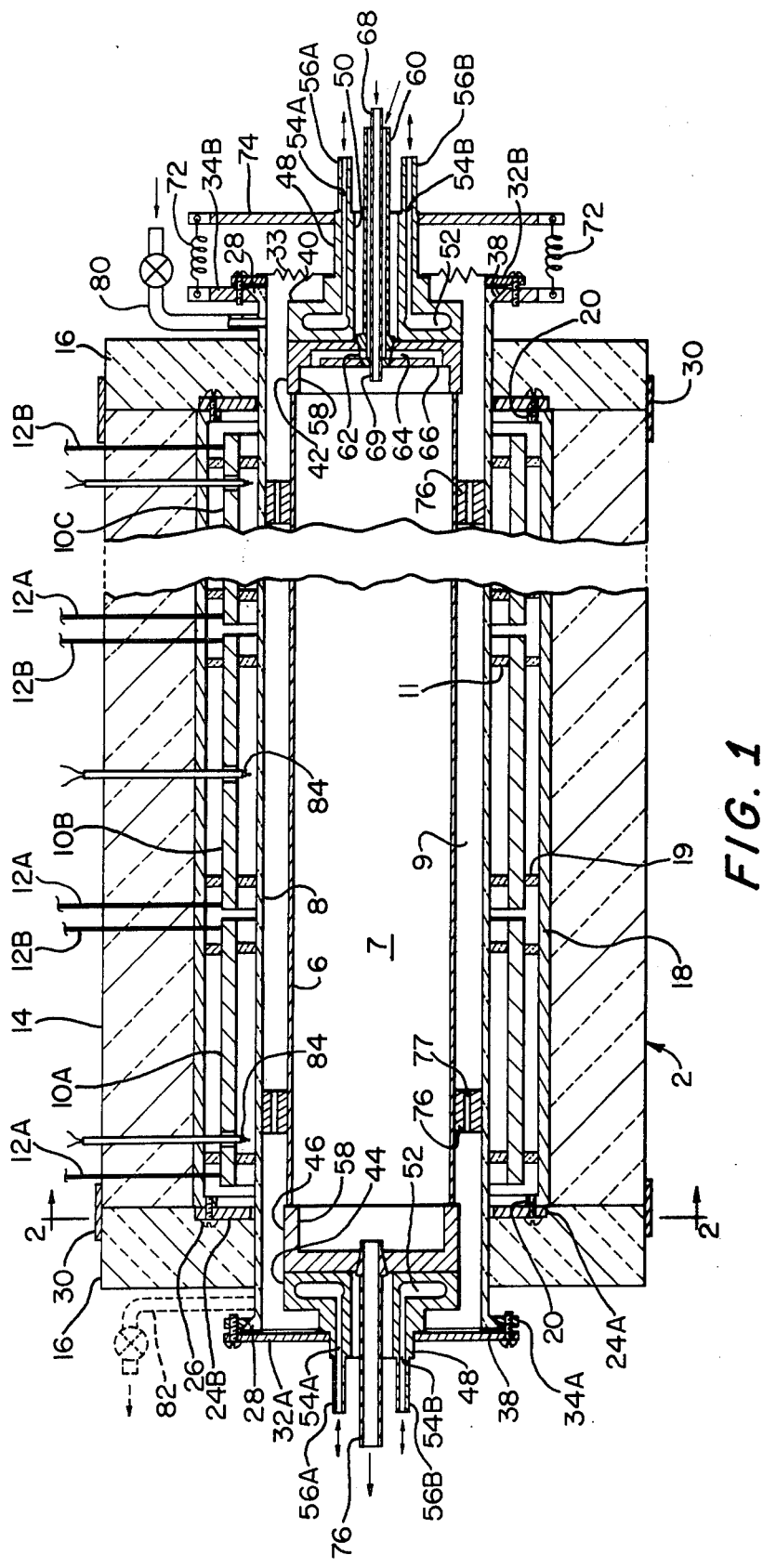
FIG. 1 is a sectional view in elevation taken along the center line of a tube furnace constituting a preferred form of apparatus made in accordance with this invention.

The apparatus shown in FIG. 1 comprises a tube furnace 2 in which is supported a silicon tube 6 that defines a reaction chamber 7. The furnace includes a muffle tube 8 surrounding tube 6. The muffle tube is made of a material which will not react with silicon. Preferably the muffle is a quartz tube, but it may be made of silicon. The essential thing is that it be made of a material which has a suitably high melting point so that it will withstand the operating temperatures, be non-contaminating to silicon and be of high purity. Surrounding the muffle tube is a heating means which may consist of a single resistance heater extending for substantially the full length of the silicon tube, but preferably consists of several tubular electrical resistor heater elements identified as 10A–10C disposed side by side and spaced from the muffle tube by graphite spacers 11. Preferably the heater elements are made of graphite, but they could be made of some other high temperature-resistant electrical resistance material. A pair of high temperature-resistant conductors 12A and 12B are connected to the opposite ends of each heater element. Although not shown, it is to be understood that conductors 12A and 12B are used to couple the heaters to a suitable a.c. or d.c. power supply so as to enable the heaters to be energized by a suitable heating current. Preferably the heating elements are connected to an a.c. power source via a power transformer and a programmable temperature controller (not shown) adapted to supply a.c. current to the heaters in variable amounts as required to maintain tube 6 in a desired thermal environment. Surrounding and spaced concentrically from the graphite heating elements is a molded outer enclosure 14 made of a suitable insulating material as hereinafter described.

Insulating enclosure 14 is terminated by end sections 16 which surround and contact end sections of muffle tube 8 and function to seal off the heater elements from the atmosphere exterior of the furnace and also to hold the enclosure concentric with the muffle. If desired or necessary the outer insulating enclosure may be reinforced by embedding in the insulating material one or more high temperature-resistant reinforcing elements e.g. in the form of parallel rods spaced from one another around the circumference of the enclosure or else cylindrical elements disposed concentric with the muffle tube.

Figure 2:
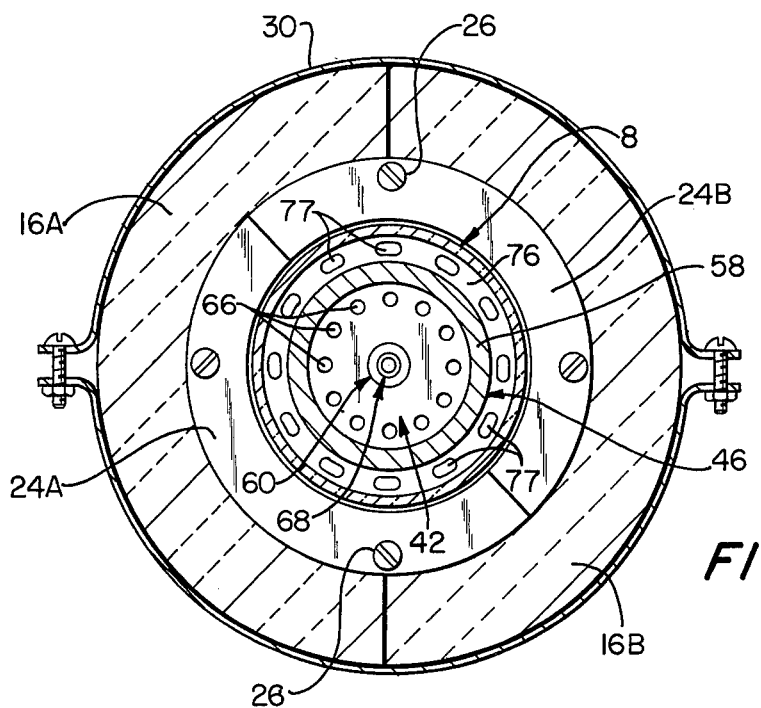
FIG. 2 is a cross-sectional view taken along line 2—2 of FIG. 1.

A preferred mode of reinforcing the insulating outer enclosure is to mount it around a high temperature resistant liner 18 as shown in FIG. 2. By way of example, the liner may be made of graphite or quartz. Preferably liner 18 is made in two mating halves which are secured together along their lengths by suitable connecting means. Graphite spacers 19 of suitable design hold liner 18 in concentric relation with heaters 10A–10C. To facilitate assembly, liner 18 is made with narrow end flanges 20 which serve as mounts for annular end plates each consisting of two identical halves 24A and 24B held in place by screws 26. The opposite ends of muffle tube 8 are formed with peripheral flanges 28 and the inner diameter of each flange 20 may be made large enough so that the muffle can be slipped out of the liner for inspection and repair after the semi-circular end plate members 24A and 24B are removed.

Regardless of whether or not liner 18 is used, disassembly of insulating enclosure 14 around the muffle may be accomplished by making that enclosure in two mating halves and/or, as shown in FIG. 2, by making each of its end sections 16 as two detachable halves 16A and 16B held fixed to each other and enclosure 14 by a releasable band 30 of stainless steel or other material. By way of example, insulating enclosure 14 and its end sections 16 are made of quartz wool, graphite wool, alumina wool, graphite foam, quartz foam, or a firebrick. Quartz or graphite wool is preferred.

Muffle tube flanges 28 serve as mounts for rigid or stiff annular end plates 32A and B which preferably are made of quartz but may be made of a stainless steel, molybdenum, graphite or other suitable material. Clamping rings 34A and B, preferably made of the same materials as end plates 32, surround the muffle and are adapted to mate with flanges 28. Rings 34A and B may be made and installed as two semi-circular halves so as to facilitate separation from the muffle. Screws 36 (made of a suitable non-reactive high temperature-resistant material) connect rings 34 and end plates 32 and causes them to be clamped tightly to flanges 28, thereby making a fluid tight joint between the flat end faces of the muffle and end plates 32. A suitable sealing member 38 may be interposed as shown to assure a reliable fluid tight seal without excessive tightening of screws 36, thereby avoiding possible damage to end flanges 28 of the muffle. By way of example, seals 38 may consist of one or more graphite sheets. End plate 32B is concentric with and secured to the periphery of a corrugated or bellows-type diaphragm 33 which may be made of a stainless steel or other suitable material. End plate 32A and end plate 32B (together with diaphragm 33) function to center and support two combination cooling head/end cap assemblies, with the assembly at the inlet end comprising a cooling head 40 and an end cap 42 and the assembly at the exit end comprising a cooling head 44 and an end cap 46. The cooling heads and end caps may be made of the same material, e.g., stainless steel, molybdenum or graphite; preferably, however, the end caps are made of quartz, graphite or silicon, while the cooling heads are made of another material such as a stainless steel or molybdenum or nickel.

The cooling head 40 at the inlet end consists of a cylindrical extension 48 and a center bore 50. The body of the cooling head 40 is formed with an internal chamber 52 and the cylindrical extension 48 is formed with two passageways 54A and 54B leading to the chamber 52 and two tubular extensions 56A and 56B connected to passageways 54A and B. The tubes 56A and 56B are used to pass cooling water through the chamber 52.

End cap 42 is attached to the inner radially extending face of cooling head 40. The end cap is formed with a tubular flange 58 at its inner side. Additionally end cap 42 has a center bore which preferably is tapered as shown to accommodate the enlarged conically-shaped inner end of a hydrogen feed tube 60. Feed tube 60 is secured to the end cap by suitable means and is formed with a series of radially extending holes 62 which communicate with radially extending passageways 64 formed in the body of end cap 42. The outer ends of these passageways terminate in discharge ports 66 which are directed into the reaction chamber 7. Mounted concentrically within feed tube 60 is a second smaller diameter feed tube 68 whose inner end 69 preferably projects beyond the discharge ports 66. Preferably feed tube 68 is nearly flush with the end face of flange 58 that engages silicon tube 6. Feed tube 68 serves as an inlet for trichlorosilane.

End plate 32B is coupled to the cooling head 40 by way of diaphragm 33. The function of the latter is to accommodate expansion of the silicon tube during the operation of the furnace as hereinafter described. Additionally, clamping ring 34B serves as an attachment for a plurality of tension springs 72 which are connected to a plate 74 that is affixed to and surrounds the cylindrical extension 48 of cooling head 40. Springs 72 act on plate 74 to urge holder 40 and cap 42 toward the silicon tube 6.

At the opposite end of the muffle the cooling head and end cap are substantially identical to elements 40 and 42, except that a single tube 76 is mounted in the center hole of the end cap 46. As shown, the holder 44 has a chamber 52 and passageways 54A and B and tubular extensions 56A and B for the purpose of circulating a cooling fluid through the chamber 52. The inner end of the discharge tube 76 preferably terminates short of the flange 58 of end cap 46. Additionally, end plate 32A makes a tight fit with the cylindrical extension 48 of cooling head 44.

As is believed obvious, the position of end cap 46 is fixed due to the rigidity of the end plate 32A, while the position of the end cap 42 is adjustable due to the extendability afforded by the bellows 33 and springs 72. In practice the silicon tube 6 is cut to a length such that when it is disposed within the muffle the springs 72 will cause the end cap 42 to press the silicon tube tight against the opposite end cap 46. The end surfaces of the silicon tube and the confronting end surfaces of the end caps 42 and 46 may be made as flat and uniform as possible, thereby assuring that the silicon tube will make a fluid tight connection with the two end caps. However, this invention may be pacticed without air-tight contact between silicon tube 6 and end caps 42 and 46, as explained hereinafter. In either case, since silicon is relatively brittle and since it is advantageous for the purposes of this invention to use a silicon tube of as large a diameter and as small a wall thickness as is possible to produce and handle, it is preferred to support the silicon tube by one or more graphite support rings 76 suitably positioned within the muffle. The support rings may be solid or, as shown, they may have holes 77 passing through them from one end to the other in order to reduce the thermal conductivity effects and also to allow passage of inert gas. Support rings 76 also may be formed with peripheral grooves to reduce contact area with silicon tube 6.

In addition to the foregoing the muffle is formed with a port at its inlet end beyond the insulating enclosure which is fitted with a tubular extension 80, preferably made of quartz, for admission of a suitable inert gas, e.g. argon or helium. Although it is not necessary, the opposite end of the muffle may be provided with a second port fitted with a tubular extension 82 for permitting inert gas to be continuously circulated through the muffle. Extension 82 also may be used solely to vent air from the muffle when filling the latter with the inert gas.

The insulating enclosure also is formed with openings through which the electrical leads for the heater elements may be brought out for connection to a suitable electric current power supply (not shown) as previously described. In order to afford precise control of the operating conditions within the furnace, it is also preferred to provide one or more temperature sensors 84 for sensing the temperature at one or more selected points and controlling the electrical power input to the heaters via suitable circuit means (not shown) such as temperature controller of known design. Each temperature sensor 84 may be a thermocouple, thermistor or other suitable device adapted to provide a control signal that varies as a function of the temperature which it senses. Since it is not convenient or practical to locate the sensors within tube 6, they are located outside of that tube at suitable positions and their outputs calibrated to indicate a temperature corresponding closely to the temperature within tube 6. Preferably sensors 84 are located between the heaters and the muffle as shown, but they could extend within the muffle or be positioned between the heaters and enclosure 14.

The foregoing apparatus makes it possible to produce silicon of high purity on the inner surface of the silicon tube 6. The decomposition reaction and the silicon precipitation occurs on the inner surface of the hot tube. As noted previously, it is advantageous to use a silicon tube 6 with a diameter as large as possible and a wall thickness as small as possible. The larger the diameter of the silicon tube 6, the greater the initial rate of silicon deposition and the longer the time before the point is reached where it becomes more economical to replace the existing tube with a new one. Having the silicon tube initially with a relatively small wall thickness is advantageous in that its cost is less and it provides a greater volume for new silicon production.

As noted previously, it is not necessary to have an hermetic seal between silicon tube 6 and end caps 42 and 46. Such a seal is not required if the inert gas pressure within the muffle is sufficient to oppose escape of reactant gases from reaction chamber 7 into the muffle. In the latter case, it may be preferred to machine the end faces of end caps 42 and 46 which engage silicon tube 6 so that they are not flat but instead have flat projections or teeth so that only selected parts of the ends of the silicon tube are frictionally engaged by the end caps. Such an arrangement is preferred where spacers 77 are used and end caps 42 and 46 frictionally grip the silicon tube tight enough to provide alignment only.

Figure 3:
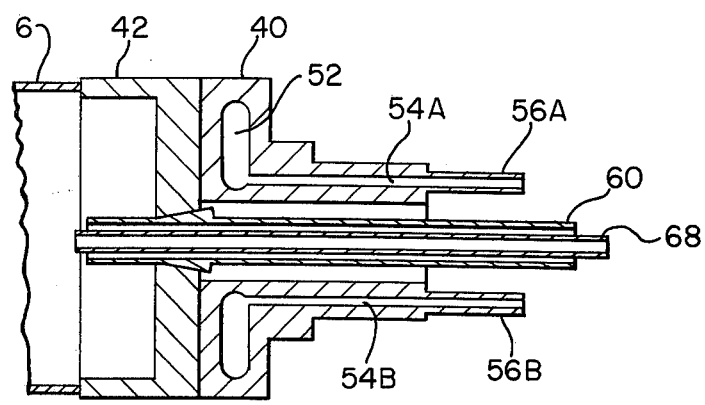
FIG. 3 is a fragmentary view of a modification of the apparatus of FIG. 1.

FIG. 3 shows a modification of the apparatus of FIG. 1. In this case the tube 60 has no radially disposed holes 62 and end cap 42 has no passageways 64 or ports 66. Instead tubes 60 and 68 are concentric and are disposed so that each tube forms a separate feed passageway for reactant gases, e.g., tube 68 feeds trichlorosilane and tube 60 feeds hydrogen. Means, not shown, are used to hold tube 68 in concentric relation with tube 60 while allowing the space between the two tubes to serve as a conduit for hydrogen.

The silicon tubes may be made in various ways. Preferably they are made by the EFG method described in U.S. Pat. No. 3,591,348 and in the technical article by Mlavsky et al., "The Tubular Silicon Solar Cell . . . " 12th IEEE Photovoltaic Specialists Conference Report, pp. 160–167, 1976. By using the EFG process, it is possible to grow silicon tubes with diameters in the order of 3 to 7 inches and with wall thicknesses in the order of 0.005 inches or less.

In the practice of this invention the inert gas which is introduced into the space between the muffle and the silicon tube is preferably argon since it is available in adequate high purity and at lesser cost than other inert gases. The inert gas is supplied to the muffle at a pressure which is at least equal to but preferably is above the pressure of the gases within reaction chamber 7. Preferably the inert gas is supplied at a pressure of about 1 to 3 inches of water above the gas pressure within chamber 7.

In the preferred mode of practicing the method of Applicant's invention with trichlorosilane, the furnace is constructed substantially as shown in FIG. 1 and has its electrical resistance heater elements energized so that the muffle and tube 6 are heated uniformly along their lengths and the tube temperature is between 1000° and 1150° C; also cooling water is introduced to the cooling heads 40 and 44 at a temperature of approximately 38° C and is circulated through the cooling heads at a rate to maintain the temperature of the end caps below about 300° C. Hydrogen is introduced via feed tube 60 and trichlorosilane is introduced through feed tube 68. Each gas is introduced at a pressure in the order of atmospheric pressure and at rates consistent with optimum production of silicon in trade-off with minimum recycle of trichlorosilane. A valve (not shown) may be attached to discharge tube 76 for the purpose of controlling the rate of outflow of the reaction products and indirectly the pressure maintained within the silicon tube 6. Preferably the trichlorosilane and the hydrogen are introduced at room temperature but they could be preheated if desired. The mole ratio of hydrogen to trichlorosilane is preferably kept between about 1.0:0.5 and 1.0:3.0.

Example I illustrates the preferred mode of practicing Applicant's invention.

EXAMPLE I

A silicon tube having a diameter of approximately 3.0 inches, a wall thickness of approximately 0.005 inch and a length of approximately 3.0 feet is inserted into the muffle and contained in position by the end caps 42 and 46 under the influence of springs 72. Graphite support rings 76 are disposed between the silicon tube and the muffle at two points located approximately 8 inches from end caps 42 and 46. The muffle has a diameter of approximately 5 inches. The several heaters are energized and controlled so that the muffle and silicon tube are heated substantially uniformly along their lengths and so that the inner surface of tube 6 is at a temperature of between about 1000° C and 1150° C; at the same time end caps 42 and 46 are cooled by circulation of water through cooling heads 40 and 44 to a temperature of between about 150° C and 300° C.

An average pressure of about 15 psi is maintained in the silicon tube. Argon gas is introduced via pipe 80 at a pressure of about 15-18 psi so as to fill the space 9 between muffle 8 and tube 6. Once the silicon tube has reached thermal equilibrium, trichlorosilane and hydrogen are introduced to the interior of the silicon tube at rates of 0.5 and 2.0 standard cubic feet per minute respectively and at a pressure of approximately 16 psi for each gas. The flow of trichlorosilane and hydrogen is maintained at the same rate for approximately 20 hours. During this time the current input to the heaters is increased as required to maintain the temperature on the inner surface of the silicon tube at between about 1000° C and 1150° C. At the end of 20 hours, the flow of reactants into the furnace is terminated. Then argon is flushed through the furnace and tube 6 while the heater elements are deenergized. Water is continued to be circulated through the cooling heads for approximately 2 hours thereafter so as to further reduce the temperature within the muffle. In this connection it is to be noted that the muffle loses heat to the cooling heads primarily by radiation. Thereafter springs 72 are detached from plate 72 and the combination cooling head/end cap assembly at the inlet end of the furnace is removed to release the silicon tube 6. The silicon tube is then removed and replaced by a new silicon tube for a repeat of the foregoing process. The removed silicon tube is found to have a thick coating of high-purity polycrystalline silicon on its inner surface for the full expanse of its circumference and along most of its length.

Of course the invention is not limited to the production of silicon by the decomposition of trichlorosilane. Instead, for example, the invention may be practiced by decomposing silane to produce silicon. Example II illustrates how silicon is produced using silane as a feed material.

EXAMPLE II

A furnace as shown in FIG. 1 is employed to produce silicon by the decomposition of silane. For this purpose feed tube 60 is plugged off and silane is fed directly through the inner feed tube 58 (alternatively feed tube 58 may be closed off and the silane may be fed through the outer feed tube and directed into the silicon tube via the discharge ports 66).

A silicon tube is disposed within the furnace in the manner described in Example I and the heater elements are energized so as to produce a temperature on the inner surface of silicon tube 6 of between about 1000° C and 1200° C. Argon is fed into the muffle as previously described in Example I, and cooling water is circulated in the same manner through the two cooling heads 40 and 44 so that end caps 42 and 46 are between about 100° C and 200° C. After temperature equilibrium of the silicon tube is achieved, silane is introduced into the furnace at a rate of approximately 0.3 standard cubic feet per minute and a gas pressure of 16 psi is maintained within the silicon tube. Reaction products are continuously removed from the silicon tube via discharge tube 76. This procedure is continued for approximately 20 hours with the heat input being increased as required to maintain a temperature of between about 1000° C and 1200° C on the inner surface of tube 6. After 20 hours, the furnace is shut down and the silicon tube cooled before being removed in the manner described in connection with Example I. The removed silicon tube is found to have a uniform deposit of high purity polycrystalline silicon on its inner surface.

In the case of decomposition of silane, consideration is given to feeding the latter into the reaction chamber at a rate which will provide a silicon deposition of suitable porosity.

It is contemplated that optimum operation will involve discontinuing the process after the deposited silicon layer has reached an inner diameter equal approximately to $\frac{1}{2}$ the original inside diameter of tube 6, and then replacing the existing "used" tube with a "fresh" tube. In this connection it is appreciated that turn-around time is important for reason of economics. Hence the faster the "used" tube is cooled down, the faster it can be replaced with a "fresh" tube. More rapid cooling can be arranged by passing a cool helium gas inside and outside of the silicon tube after the deposition reaction has been terminated.

While it is possible for the silicon which is deposited on the inner surface of tube 6 by this invention to be substantially monocrystalline if a substantially monocrystalline tube is used as the reaction chamber, for the most part the silicon deposition tends to be polycrystalline. Whatever the crystalline form of the silicon, the silicon is nevertheless suitable for use in the manufacture of silicon crystals for use as solar cells and other semiconductors due to its high purity.

Of course, if desired, a suitable dopant may be introduced into the furnace along with one or more of the reactants. However, this is not preferred since the polycrystalline material which is deposited has to be converted to single crystal material in order for use in semiconductor devices, and the dopants are better added during the formation of the single crystals.

It is also contemplated that the hydrogen and the trichlorosilane may be admixed to some degree within the feed tube used to inject the trichorosilane, but in such case the discharge end of the feed tube must be at a temperature which is below the temperature at which decomposition occurs, in order to make certain that deposition of silicon does not occur at the discharge end of the feed tube since this would clog the feed tube and interrupt the growth process. The circulation of cooling water through the cooling heads helps assure that decomposition and deposition does not occur at the discharge ports 66 or the inner ends of the tubes 60 and 76. Preferably end caps 42 and 46 and all of the reactant feed and discharge tubes, e.g. tubes 60, 68 and 76, are kept at a temperature which is at least 150° C and preferably at least 250° C below the temperature at which the silicon-rich feed gas will disproportionate and cause deposition of silicon. It is preferred that end caps 42 and 46 and tubes 58, 60 and 76 be at a temperature of between about 150° C and 300° C where trichlorosilane is the feed and between about 100° C and 200° C where silane is the feed gas.

It is contemplated that an inert diluent gas such as argon or helium may be fed in with the reactant gas or gases, either as a premixture or separately via an additional feed tube.

In the case of trichlorosilane the silicon tube is heated so as to keep its inner surface at a temperature of at least about 950° C and below about 1250° C, and preferably between about 1000° C and 1150° C. In the case of silane, the inner surface of the tube is kept at least as high as 800° C and below about 1100° C, and preferably between about 900° C and 1000° C. Where other silicon-containing feed gases are used, e.g. silicon tetrachloride, the reaction conditions are modified as required to achieve satisfactory disproportionation and deposition.

The invention also may be modified by using RF rather than electrical resistance heating. However, in such case some means may be provided to preheat the silicon tube or a susceptor provided for the graphite muffle since silicon may not absorb and be heated by RF energy until it is at an elevated temperature. However, RF heating is not preferred since it is more costly to implement. It is appreciated that silicon tube 6 also could be heated by passing an electrical current through it, but this is not a practical, i.e. cost effective alternative, for a number of reasons including difficulty and cost of varying the current to control tube temperature as wall thickness increases and providing suitable and dependable electrodes for passing current through the tube. The use of electrical resistance heaters as herein described is advantageous in that it is possible to utilize standard heater elements designed for muffle furnaces according to well established heater and furnace criteria.

Of course the silicon tube 6 which forms the reaction chamber need not be cylindrical as shown but could be polygonal in cross-section, e.g. a tube having a square, rectangular, hexagonal or octagonal cross-sectional shape. While a tube grown according to the EFG method is preferred, it also is contemplated that the tube could be grown or made by other methods. Thus, for example, a tube with a cross-section in the shape of a regular polygon, e.g., a hexagon, may be formed by disposing a plurality of flat silicon ribbons edge to edge so as to form a desired polygonal arrangement and then depositing silicon on the interior or exterior surfaces of the ribbons so as to interconnect them with a deposited integral layer of silicon. The resulting tube may be used as the reaction tube 6. It is appreciated that a reaction tube of polygonal cross-section may be preferred in certain circumstances.

It also is appreciated that the exit cooling head/end cap assembly could be modified so as to be similar to the inlet cooling head/end cap assembly, whereby to permit an inert gas like argon to be fed into the downstream end of the silicon tube via ports like ports 66 to act as a diluent and barrier sheath to prevent deposition on end cap 46.

Although not specifically illustrated or exemplified herein, it is to be understood that provision may be made for recovering unreacted silicon halide and recycling the same back into the inlet end of reaction chamber 7, whereby to maximize yield. A further contemplated modification or extension of the invention is to connect two or more furnaces in series, whereby the unreacted silicon halide from the silicon tube in one furnace is fed into the silicon tube in the next furnace. In such case additional silicon halide feed may be introduced into each succeeding silicon tube to assure adequate production rates.

Still another possible modification and advantage of the invention is that it may be used to produce other materials such as germanium, using tubes of silicon or of germanium or whatever other material is being produced. Such tubes may be made by the EFG process or by other methods known to persons skilled in the art or as described herein. Thus tubular germanium reaction chambers would be formed by assembling flat germanium strips and securing them together as previously described with respect to the formation of silicon tubes. However, for producing silicon the starting tube should be a silicon tube. Tubes made of quartz and carbon present a problem in that difficulties exist in trying to recover the silicon product that is deposited on the inside of the tube. Furthermore, quartz tubes are quite expensive while carbon tubes are impractical because they introduce impurities into the silicon product.

Another advantage is that it opens up the optimization of operating parameters of temperature and pressure since reaction temperature may be increased at reasonable cost due to reduced heat losses by radiation.

Other advantages also are obtained, of which the most important advantage is energy savings. In this case energy savings result primarily from the fact that the reaction is carried out in a muffle furnace which is insulated on the outside, so that substantially all of the heat generated by the heater assembly is directed to the silicon tube 6 and the reaction chamber 7. In contrast prior methods and systems which involve deposition on a silicon substrate in a quartz vessel are handicaped by the fact that the vessel must be cooled to prevent deposition of silicon on its walls instead of or in addition to depositions onto the selected substrate. Also in the Siemens process the heat loss increases in proportion to the growing surface area of the deposited silicon. The present invention also offers promise of higher yield due to better process control capability and a better chance of contacting and depositing on the hot tube. This means less recycling of reactants than in prior methods. A further advantage of using silane is that is is decomposable at relatively low temperatures and in any event it produces no side products other than hydrogen. Still other advantages will be obvious to persons skilled in the art.

What is claimed is:

1. Apparatus for producing a selected semiconductor material comprising:

a muffle;

a tube of a selected semiconductor material within said muffle, said tube having first and second opposite ends;

means for supporting said tube within said muffle;

means surrounding said muffle for heating said tube;

heat insulation means surrounding said muffle for substantially preventing loss of heat from said muffle;

a supply of a gaseous semiconductor compound containing said selected semiconductor material;

first and second end means for closing off the first and second opposite ends respectively of said tube, said first and second end means being adapted to provide an air-tight connection to the ends of said tube, said first end means including first and second concentric conduits for feeding said semiconductor compound and hydrogen into the first end of said tube, said first conduit communicating directly with the interior of said tube near the center thereof, and said second conduit communicating with the interior of said tube via several discharge ports which are in said first end means and are located so as to discharge gas into the reaction chamber; and means connected to said second end mens for removing any unreacted portion of said semiconductor compound from said tube.

2. Apparatus according to claim 1 wherein said tube is silicon.

3. Apparatus according to claim 1 further including means for cooling at least said first end means.

4. Apparatus according to claim 1 including means for introducing an inert fluid medium into said muffle for maintaining an inert environment between said tube and said muffle.

5. Apparatus according to claim 3 wherein said cooling means comprises means for circulating a water coolant through said end means.

* * * * *

UNITED STATES PATENT AND TRADEMARK OFFICE
CERTIFICATE OF CORRECTION

PATENT NO. : 4123989
DATED : November 7, 1978
INVENTOR(S) : David N. Jewett

It is certified that error appears in the above-identified patent and that said Letters Patent are hereby corrected as shown below:

Claim 1, column 12, line 13, "mens" should be -- means --.

Signed and Sealed this

Thirteenth Day of March 1979

[SEAL]

Attest:

RUTH C. MASON
Attesting Officer

DONALD W. BANNER
Commissioner of Patents and Trademarks